United States Patent [19]

Shanklin et al.

[11] Patent Number: 5,055,372

[45] Date of Patent: Oct. 8, 1991

[54] PHOTOHARDENABLE COMPOSITION CONTAINING BORATE SALTS AND KETONE INITIATORS

[75] Inventors: Michael S. Shanklin, Dayton; Peter Gottschalk, Centerville; Paul C. Adair, Springboro, all of Ohio

[73] Assignee: The Mead Corporation, Dayton, Ohio

[21] Appl. No.: 512,700

[22] Filed: Apr. 23, 1990

[51] Int. Cl.$^5$ .......................... G03C 1/68; G03C 1/72
[52] U.S. Cl. ..................................... 430/138; 430/218; 430/913; 430/914; 430/916; 430/919; 522/14; 522/15; 522/25; 522/28
[58] Field of Search ............... 430/138, 281, 913, 914, 430/916, 919; 522/14, 15, 25, 28

[56] References Cited

U.S. PATENT DOCUMENTS

| | | | |
|---|---|---|---|
| 4,713,312 | 12/1987 | Adair et al. | 430/394 |
| 4,772,530 | 9/1988 | Gottschalk et al. | 430/281 |
| 4,772,541 | 9/1988 | Gottschalk et al. | 430/339 |
| 4,788,124 | 11/1988 | Wright | 430/254 |
| 4,800,149 | 1/1989 | Gottschalk et al. | 430/281 |
| 4,840,866 | 6/1989 | Kovacs et al. | 430/138 |
| 4,917,977 | 4/1990 | Smothers | 430/281 |
| 4,935,329 | 6/1990 | Hipps, Sr. et al. | 430/253 |
| 4,940,645 | 7/1990 | Davis et al. | 430/438 |
| 4,950,581 | 8/1990 | Koike et al. | 430/138 |
| 4,954,414 | 9/1990 | Adair et al. | 430/138 |
| 4,956,253 | 9/1990 | Nakamura | 430/138 |

FOREIGN PATENT DOCUMENTS 0353030 1/1990 European Pat. Off. .

Primary Examiner—Charles L. Bowers, Jr.
Assistant Examiner—Patrick A. Dody
Attorney, Agent, or Firm—Thompson, Hine and Flory

[57] ABSTRACT

A photohardenable composition comprising a free radical addition polymerizable or crosslinkable compound and an aromatic ketone and a borate salt; and photosensitive materials employing the composition where in one embodiment the composition is microencapsulated.

17 Claims, No Drawings

PHOTOHARDENABLE COMPOSITION CONTAINING BORATE SALTS AND KETONE INITIATORS

BACKGROUND OF THE INVENTION

1. Field of the Invention

The present invention relates to novel photohardenable compositions and to photosensitive materials employing them. More particularly, it relates to free radical addition polymerizable compositions involving the use of borate salts in combination with aromatic ketone photoinitiators to produce a system capable of efficient initiation of free-radical polymerization. These compounds are particularly effective when used in combination with an autoxidizer.

2. Description of the Prior Art

Dye-sensitized photopolymerizable compositions are known in the art. A survey of these systems is provided by Eaton, D. E., "Dye Sensitized Photopolymerization," *Advances in Photochemistry*, Vol. 13, pp. 427-87 (1985). In their simplest form these compositions include a photopolymerizable vinyl compound, a photoreducible or photooxidizable dye and an activator which functions as a reducing agent or an oxidizing agent for the dye. The dyes are excited by light to a triplet state which reacts with the reducing agent or oxidizing agent to yield radicals which can initiate polymerization. There are a number of examples of dye-sensitized photopolymerizable compositions in the patent literature. See Oster, U.S. Pat. Nos. 2,850,445 and 2,875,047 (Rose Bengal with hydrazine or thiourea); 2,547,633 (quinoidal family dyes with triorganophosphines, triorganoarsenines or sulfinic acid derivatives); 3,615,452 (phenazine or oxazine dyes and diazonium salts); 3,627,656 (phenothiazine dyes and sulfinic compounds); 3,495,987 (cyanine dyes and bromine donors) and 3,488,269 (thionine dyes and methylenes or methines).

Pursuant to the usual methods known in the art, additives are often included in the photohardenable compositions to more efficiently produce free-radicals from the photoexcited photoinitiators. Among the most popular additives are derivatives of dimethylaniline and other tertiary amines. These tertiary amine additives generally promote more efficient free-radical generation through an autoxidation cycle as described in allowed U.S. Application Ser. No. 300,168 filed Jan. 19, 1989.

U.S. Pat. No. 4,772,541 to The Mead Corporation discloses free radical addition polymerizable compositions employing a cationic dye-borate anion complex as a novel photoinitiator. The mechanism whereby this complex absorbs energy and generates free radicals is not entirely clear, however, it is believed that upon exposure to actinic radiation, the dye in the complex is excited to a singlet state in which it accepts an electron from the borate anion. The borane radical breaks down and yields a free radical. In solution in the polymerizable compound, ionic pairing of the borate anion and the cationic dye is believed to promote efficient electron transfer.

In U.S. Application Ser. No. 426,819 filed Oct. 25, 1989, the use of borate salts in combination with dye borate initiators is disclosed.

SUMMARY OF THE INVENTION

In accordance with the present invention a novel photoinitiator composition and photohardenable compositions and photosensitive materials employing the same are provided. The photoinitiator composition of the present invention comprises an aromatic ketone compound as an absorber and a borate salt. Specifically, it has been found that when a radiation absorber such as a ketocoumarin is associated with a borate salt, more efficient free radical polymerization is achieved.

The mechanism whereby this complex absorbs energy and generates free radicals is not entirely clear, but it is believed upon exposure to actinic radiation, the aromatic ketone accepts an electron from the borate salt which yields a free radical analogous to the electron transfer which occurs in the dye borate complex.

A principal object of the present invention is to provide a photoinitiator composition which comprises an aromatic ketone absorber and a borate salt.

A further object of the present invention is to provide photohardenable compositions which are useful in the imaging materials described in U.S. Pat. Nos. 4,399,209 and 4,440,846, as photoresists, in forming polymer images, as photoadhesives, in composites, in stereolithography, and in other known applications for photohardenable compositions.

These and other objects are accomplished in accordance with the present invention which, in one embodiment, provides a photohardenable composition comprising:

a free-radical addition polymerizable or crosslinkable compound;

an aromatic ketone absorber; and a borate salt, the borate salt being soluble in the polymerizable or crosslinkable compound.

Another embodiment of the present invention resides in a photosensitive material comprising a support having a layer of photosensitive microcapsules on the surface thereof, at least a portion of said microcapsules containing as an internal phase the aforesaid photohardenable composition.

A further embodiment of the present invention resides in a photosensitive material comprising a support having a layer of the aforesaid photohardenable composition on the surface thereof.

DETAILED DESCRIPTION OF THE INVENTION

U.S. Pat. Nos. 4,399,209; 4,440,846; 4,842,976; and 4,772,541 are incorporated herein by reference to the extent that reference thereto may be necessary to complete this disclosure.

The borate salts used in the present invention can be represented by the general formula (I):

where $Z^+$ is a cation which renders the borate salt soluble in the photohardenable composition such as a quaternary ammonium ion; $R^{11}$, $R^{12}$, $R^{13}$ and $R^{14}$ are independently selected from the group consisting of alkyl, aryl, alkaryl, allyl, aralkyl, alkenyl, alkynyl, alicyclic and saturated or unsaturated heterocyclic groups. Preferably $R^{11}$, $R^{12}$, and $R^{13}$ are aryl groups and more preferably phenyl groups and $R^{14}$ is an alkyl group and more preferably a secondary alkyl group.

The borate anion is designed such that the borate radical generated upon exposure to light and after electron transfer readily dissociates with the formation of a radical as follows:

$$BR_4 \rightarrow BR_3 + R\cdot$$

Each of $R^{11}$, $R^{12}$, $R^{13}$ and $R^{14}$ can contain up to 20 carbon atoms, and they typically contain one to seven carbon atoms. Preferably, at least one but not more than three of $R^{11}$, $R^{12}$, $R^{13}$ and $R^{14}$ is an alkyl group. More preferably $R^{11}$-$R^{14}$ are a combination of alkyl group(s) and aryl group(s) or aralkyl group(s), and more preferably a combination of three aryl groups and one alkyl group.

For example, particularly preferred anions are triphenylbutylborate and trianisylbutylborate anions because they readily dissociate to triphenylborane or trianisylborane and a butyl radical. On the other hand tetrabutylborate anion does not work well presumably because the tetrabutylborate radical is not stable and it readily accepts an electron back from the original electron acceptor in a back electron transfer and does not dissociate efficiently. Likewise, tetraphenylborate anion is very poor because the phenyl radical is not easily formed.

Representative examples of alkyl groups represented by $R^{11}$-$R^{14}$ are methyl, ethyl, propyl, butyl, pentyl, hexyl, octyl, stearyl, etc., cyclobutyl, cyclopentyl, and cyclohexyl groups. Secondary alkyl groups are preferred. The alkyl groups may be substituted, for example, by one or more halogen, cyano, acyloxy, acyl, alkoxy or hydroxy groups.

Representative examples of aryl groups represented by $R^{11}$-$R^{14}$ include phenyl, napthyl and substituted aryl groups such as anisyl and alkaryl groups such as methylphenyl, dimethylphenyl, etc. Representative examples of aralkyl groups represented by $R^{11}$-$R^{14}$ groups include benzyl. Examples of an alkynyl group are propynyl and ethynyl, and examples of alkenyl groups include a vinyl group.

Specific examples of useful borate salts are quaternary ammonium triphenylalkyl borates such as quaternary ammonium triphenylbutylborate, quaternary ammonium triphenyl sec-butyl borate, quaternary ammonium triphenylbenzyl borate.

Typically, $Z^+$ will be a quaternary ammonium ion as this ion can be substituted with organophilic groups which enhance the solubility of the salt in the monomer. Other organophilic cations include pyridinium, phosphonium, sulfonium. Representative examples of quaternary ammonium ions include trimethylcetylammonium, cetylpyridinium, and tetramethylammonium. Typical salt concentrations are disclosed below. The cation must impart sufficient solubility to the salt to be an effective initiator.

The quaternary amine cation/borate anion complexes can be prepared by the addition of the magnesium chloride salt of a borate to a 10% aqueous solution of a quaternary ammonium salt.

In another embodiment of the invention the dye borates described in U.S. Pat. No. 4,772,541 are used as borate salts. While not desiring to be bound, in this embodiment, the dye moiety is believed to function as a vehicle for solubilizing the borate anion in the monomer.

The most typical examples of a free radical addition polymerizable or crosslinkable compound useful in the present invention is an ethylenically unsaturated compound and, more specifically a polyethlenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylopropane, pentaerythritol, and the like; and acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate. A tendency has been observed for more viscous monomers to reduce short-time scale reciprocity failure. A combination of TMPTA and DPHPA may be preferred for this reason.

The borate salt is usually used in an amount up to about 5% by weight based on the weight of the photopolymerizable or crosslinkable species in the photohardenable composition. More typically, the borate salt is used in an amount of about 0.2% to 0.5% by weight.

Aromatic ketone initiators useful in the present invention include xanthones, thioxanthones, benzophenones, oximinoketones, polycyclic quinones, and ketocoumarins. Representative examples include α-alkoxy phenyl ketones, O-acylated α-oximinoketones, substituted benzophenones, chlorosulfonyl and chloromethyl benzophenones and fluorenones, α-phenylacetophenones;

α-alkoxyphenyl ketones of the formula (II):

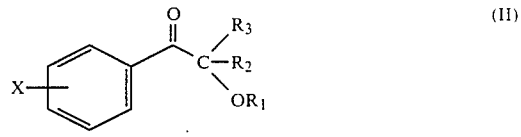

where $R^1$ is a C(1–4) alkyl group (e.g., methyl, ethyl, n-propyl, i-propyl, t-butyl, etc.), $R^2$ is a phenyl group or a substituted phenyl group wherein said substituent is as defined for X below, $R^3$ is hydrogen or a C(1–4) alkyl group, and X is hydrogen, an alkoxy group having 1 to 4 carbon atoms (e.g., methoxy, ethoxy, propyloxy, etc.), a dialkylamino group wherein said alkyl group contains 1 to 4 carbon atoms, a nitro group, a nitroso group, a cyano group, a mercapto group, chlorine, bromine or iodine, an alkyl group having 1 to 4 carbon atoms, an alkenyl group having 1 to 4 carbon atoms, an acyl group, a phenyl group, or a carboalkoxy group having two to five carbon atoms;

an α, α,dialkoxyphenyl ketone of the formula (III):

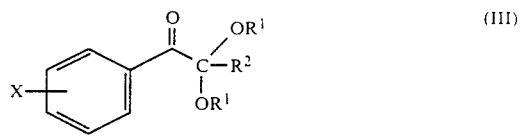

where $R^1$, $R^2$, and X are defined as in formula (II); benzophenones of the formula (IV):

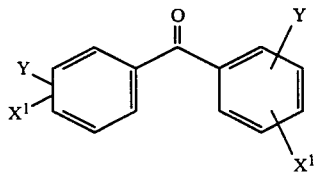

(IV)

where X' is hydrogen, an amino group, or a dialkylamino group, the alkyl group having 1 to 4 carbon atoms, and Y is hydrogen, an alkyl group having 1 to 4 carbon atoms, an alkoxy group having 1 to 4 carbon atoms, an alkenyl group having 1 to 4 carbon atoms, a phenyl group, a substituted phenyl group, a dialkylamino group, a nitro group, a nitroso group, a cyano group, a mercapto group, chlorine, bromine, iodine, or an acyl group; 1-phenyl-1,2-propanedione-2-O-benzoyloxime, 9,10-phenanthraquinone, 9,10-anthraquinone, xanthone, a chloroxanthone, a chloromethyl xanthone, a chlorosulfonyl xanthone, thioxanthone, a chlorothioxanthone, a chloromethyl thioxanthone, a chlorosulfonyl thioxanthone, a chloromethyl benzophenone, a chlorosulfonyl benzophenone, a chloromethyl fluorenone, a chlorosulfonyl fluorenone, benzoin ethyl ether.

Representative examples of ketocoumarin compounds useful in the present invention are described in U.S. Pat. No. 4,147,552 to Eastman Kodak Company and can be represented by the formula (V):

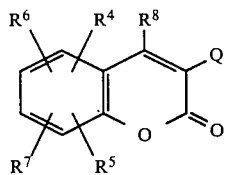

(V)

wherein Q is —CN or —Z—$R^1$ is carbonyl, sulfonyl, sulfinyl or arylenedicarbonyl; $R^1$ is hydroxy, an alkenyl group having 2 to 12 carbon atoms (e.g., vinyl, styryl, etc.); an alkyl group having 1 to 12 carbon atoms (e.g., methyl, ethyl, propyl, amyl, heptyl, etc.); an alkoxy group having 1 to 12 carbon atoms (e.g., methoxy, ethoxy, butoxy, etc.); an aryl group having 6 to 10 nuclear carbon atoms (e.g., phenyl, naphthyl, etc.); a carbocyclic group having 5 to 12 carbon atoms (e.g., cyclohexyl); or a heterocyclic group having 5 to 15 nuclear carbon and hetero atoms (e.g., 3-pyridyl, 4-pyridyl, furyl, thienyl, pyridinium, or coumarinyl);

$R^4$–$R^7$ independently represent hydrogen, an alkoxy group having 1 to 6 carbon atoms, a dialkylamino group which each alkyl group having 1 to 4 carbon atoms (e.g., diethylamino), a halogen atoms (e.g., chloro, iodo, etc.), an acyloxy group, a nitro group, a 5- or 6-membered heterocyclic group, or a group having the formula (VI):

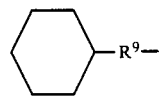

(VI)

wherein $R^9$ is an alkylene group having from 1 to 5 carbon atoms; $R^8$ is hydrogen, an alkyl group having from 1 to 4 carbon atoms, an aryl group having 5 to 10 nuclear carbon atoms, or an acyl group having 2 to 6 carbon atoms (e.g., acetyl); and wherein two or three of $R^4$–$R^7$ and the nuclear carbon atoms to which they are attached can together form a fused ring or fused ring system, each ring being a 5- or 6-membered ring.

In accordance with the most preferred embodiments of the invention Q is —Z—$R^{10}$, Z is carbonyl, and $R^{10}$ is a heterocyclic group, carbocyclic group, or an aryl group.

3-Substituted coumarin compounds which are useful in the present invention include: 7-diethylamino-5′, 7′-dimethoxy-3,3′-carbonylbiscoumarin; 3-3′-carbonylbis(5,7-dimethoxycoumarin); 7-diethylamino-3,3′-carbonylbiscoumarin; 7-diethylamino-7′-methoxy-3,3′-carbonylbiscoumarin; 7-diethylamino-7′dimethylamono-3,3′-carbonylbiscoumarin; 7-diethylamino-3-thenoylcoumarin; 3-(2-coumariloyl)-7-diethylaminocoumarin; 3-cinnamoyl-7-diethylaminocoumarin; and 3[(4-dimethylamino)-cinnamoyl]-7-diethylaminocoumarin.

These compounds can be prepared in accordance with the teachings in U.S. Pat. No. 4,147,552.

Other aromatic ketone absorbers include 9,10-phenanthrenequinones such as 2-methyl-9,10-phenanthrenequinone and 2-dodecyl-9,10-phenanthrenequinone; camphorquinone and the compounds

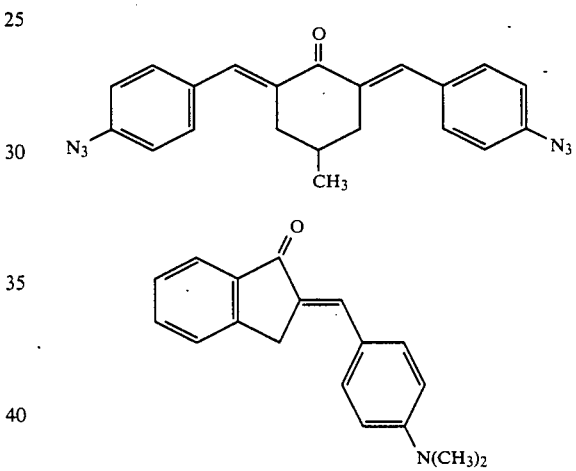

The sensitivity among these compounds can be shifted by adding substituents such that the compounds generate radicals when exposed to the desired radiation wavelength. For visible (blue) light sensitivity, the aforementioned photoinitiators may be combined with a sensitizer such as Michler's ketone or an analogous dialkylamino benzophenone thereof, a substituted coumarin, a linear polyene (e.g., trans β-carotene) or sensitizing dye, e.g., a yellow dye.

The ketone initiator will be used in amounts ranging from 0.1% to 20% depending upon the initiator which is selected, the thickness of the layer to be polymerized, and the extinction coefficient of the ketone.

It has been found that it is preferable to use the borate salt in combination with an autoxidizer. An autoxidizer is a compound which is capable of consuming oxygen in a free radical chain process.

Examples of useful autoxidizers are N,N-dialkylanilines. Examples of preferred N,N-dialkylanilines are dialkylanilines substituted in one or more of the ortho-, meta-, or para- position by the following groups: methyl, ethyl,isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, phenoxy, hydroxy, acetyloxy, methylthio, ethylthio, isopropylthio, thio-(mercapto-), acetylthio, fluoro, chloro, bromo, and iodo.

Representative examples of N,N-dialkylanilines useful in the present invention are 4-cyano-N,N-dimethylaniline, 44-acetyl,N,N-dimethylaniline, 4-bromo-N,N-dimethylaniline, ethyl 4-(N,N-dimethylamino)benzoate, 3-chloro-N,N-dimethylaniline, 4-fluoro-N,N-dimethylaniline, 4,methyl-N,N-dimethylaniline, 4-ethoxy-N,N-dimethylaniline, N,N-diethylthioanicidine, 4-amino-N,N-dimethylaniline, 3-hydroxy-N,N-dimethylaniline, N,N,N',N'-tetramethyl-1,4-dianiline, 4-acetamido-N,N-dimethylaniline, etc.

Preferred N,N-dialkylanilines are substituted with an alkyl group in the ortho-position and include 2,6-diisopropyl-N,N-dimethylaniline, 2,6-diethyl-N,N-dimethylaniline, N,N,2,4,6-pentamethylaniline (PMA), and p-t-butyl-N,N-dimethylaniline.

The autoxidizers are preferably used in the present invention in concentrations of about 0.5-2% by weight.

Another useful autoxidizer is phosphines and fluorophosphites such as triphenylphosphine, tri(4-methoxyphenyl)phosphine, Ethanox 398 (available from Ethyl Corp.), etc.

The photohardenable compositions of the present invention can be coated upon a support in a conventional manner and used as a photoresist or in a photolithography to form a polymer image; or they can be encapsulated in discrete microcapsules or dispersed in a binder as described in U.S. Pat. Nos. 4,399,209 and 4,440,846 and used to control the release of an image-forming agent. The latter process is known as cylithography and typically involves image-wise exposing the photosensitive material to actinic radiation and subjecting the layer of microcapsules to a uniform rupturing force such as pressure, abrasion, ultrasonic energy, or heat.

Several processes can be used to form color images as explained in U.S Pat. No. 4,842,976.

The present invention is not necessarily limited to embodiments where the image-forming agent is present in the internal phase. Rather, this agent may be present in the capsule wall of a discrete capsule or in the binder of an open phase system or in a binder or coating used in combination with discrete capsules or an open phase system designed such that the image-wise ruptured capsules release a solvent for the image-forming agent. Embodiments are also envisioned in which a dye or chromogenic material is fixed in a capsule wall or binder and is released by interaction with the internal phase upon rupturing the capsules.

The most common substrate for cylithographic materials is paper. The paper may be a commercial impact raw stock, or special grade paper such as cast-coated paper or chrome-rolled paper. The latter two papers are preferred when using capsules having a diameter between approximately 1 and 5 microns, because the surface of these papers is smoother and therefore the capsules are not as easily embedded in the stock fibers. Transparent substrates such as polyethylene terephthalate and translucent substrates can also be used in this invention. Their advantage is that the latent image formed need not be reversed for printing. In other applications conventional substrates may be used such as printing plate supports (e.g., anodized aluminum).

Thus, the present invention involves the use of monomer soluble borate salts and more particularly quaternary ammonium triarylalkyl borate in combination with an aromatic ketone to produce a system capable of efficient initiation of free-radical polymerization.

EXAMPLE 1

To 50 g portions of TMPTA were added 0.1 g of 7-diethylamino-3-cinnamoylcoumarin 0.37 mmol of each of five additives were added. The solutions were stirred until all solid material was dissolved, and the solutions were cooled to room temperature.

The additives used were (1) ethyl-p-dimethylaminobenzoate, (2) N-phenyl glycine, (3) tetramethylammonium tris(t-butylphenyl)butylborate, (4) trimethylcetylammonium triphenylbutylborate, and (5) cetylpyridinium triphenylbutylborate.

A test of relative photopolymerization efficiency was conducted as follows: A small drop of the prepared solution was placed between glass microscope slides. The resultant slide was exposed to the light from two F15T8D Daylight fluorescent tubes from General Electric, placed 6 cm from the sample. Times were recorded for the first notable polymerization and for full slide immobilization.

| Additive | 1 | 2 | 3 | 4 | 5 |
|---|---|---|---|---|---|
| Polymerization Time (sec) | 90/93 | 16/18 | 31/33 | 94/96 | 28/30 |

A known, good autoxidant, triphenylphosphine (0.3 g), was added to each sample solution and dissolved by heating. A 0.7 neutral density filter was placed between the light source and the sample to attenuate the light. Resultant slide test data is shown below:

| Additive | 1 | 2 | 3 | 4 | 5 |
|---|---|---|---|---|---|
| Polymerization Time (sec) | 78/84 | 80/85 | 10/11 | 18/27 | 14/18 |

EXAMPLE 2

Example 1 was repeated, only 0.1 g compound 7-diethylamino-3-thenoylcoumarin was used as the ketone chromophore. The resultant slide-test data is shown below:

| Additive | 1 | 2 | 3 | 4 | 5 |
|---|---|---|---|---|---|
| Polymerization Time (sec) | 58/60 | 10/11 | 10/11 | 23/24 | 14/15 |

To each sample was added 0.3 g triphenyl phosphine. A 0.4 neutral density filter was placed between the light source and the sample to attenuate the light. Resultant slide test data is shown below:

| Additive | 1 | 2 | 3 | 4 | 5 |
|---|---|---|---|---|---|
| Polymerization Time (sec) | 75/80 | 35/37 | 5/6 | 6/7 | 6/8 |

EXAMPLE 3

Example 1 was repeated, only 0.1 g of compound 3,3'-carbonylbis (7-diethylaminocoumarin) was used as the ketone chromophore. The resultant slide-test data is shown below:

| Additive | 1 | 2 | 3 | 4 | 5 |
|---|---|---|---|---|---|
| Polymerization Time (sec) | 43/45 | 6/7 | 6/7 | 22/23 | 10/11 |

To each sample was added 0.3 g of triphenyl phosphine. A 0.4 neutral density filter was placed between the light source and sample. Resultant slide test data is shown below.

| Additive | 1 | 2 | 3 | 4 | 5 |
|---|---|---|---|---|---|
| Polymerization Time (sec) | 35/37 | 24/26 | 4/5 | 6/8 | 7/8 |

Thus it was shown that in combination with ketone chromophores, monomer-soluble borate salts can readily act to produce free radicals which are capable of efficient polymerization. These compounds are especially effective when used in combination with a compound which is highly efficient at autoxidation.

Having described the invention in detail and by reference to preferred embodiments thereof, it will be apparent that modifications and variations are possible without departing from the scope of the invention defined in the appended claims.

What is claimed is:

1. A photosensitive material comprising a support having a layer of a photohardenable composition on the surface thereof, said composition comprising a free radical addition polymerizable or crosslinkable compound, an aromatic ketone absorber, and a borate salt soluble in the polymerizable or crosslinkable compound in an amount sufficient to initiate polymerization, wherein said borate salt is represented by the formula:

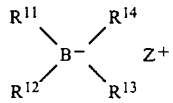

where $Z^+$ is a trimethylcetyl ammonium or a cetylpyridinium cation and $R^{11}$, $R^{12}$, $R^{13}$ and $R^{14}$ are the same or different and selected from the group consisting of alkyl, aryl, aralkyl, alkaryl, alkenyl, alkynyl, alicyclic, heterocyclic, and allyl groups.

2. The photosensitive material of claim 1 wherein said polymerizable or crosslinkable compound is an ethylenically unsaturated compound.

3. The photosensitive material of claim 1 wherein one of $R^{11}$, $R^{12}$, $R^{13}$ and $R^{14}$ is an alkyl group and the balance are aryl groups.

4. The photosensitive material of claim 3 wherein said aromatic ketone is selected from the group consisting of xanthones, thioxanthones, benzophenones, oximinoketones, polycyclic quinones, and ketocoumarins.

5. The photosensitive material of claim 4 wherein said ketone is a ketocoumarin.

6. The photosensitive material of claim 5 wherein said ketocoumarin is selected from the group consisting of 7-diethylamino-5',7'-dimethoxy-3,3'-carbonylbiscoumarin; 3-3'-carbonylbis(5,7-dimethoxycoumarin); 7-diethylamino-3,3'-carbonylbiscoumarin; 7-diethylamino-7'-methoxy-3,3'-carbonylbiscoumarin; 7-diethylamino-7'dimethylamono-3,3'-carbonylbiscoumarin; 7-diethylamino-3-thenoylcoumarin; 3-(2-coumariloyl)-7-diethylaminocoumarin; 3-cinnamoyl-7-diethylaminocoumarin; and 3[(4-dimethylamino)-cinnamoyl]-7-diethylaminocoumarin.

7. The photosensitive material of claim 6 wherein said ketocoumarin is selected from the group consisting of 7-diethylamino-3-cinnamoylcoumarin, 7-diethylamino-3-theonoylcoumarin, and 3,3'-carbonylbis(7-diethylaminocoumarin).

8. The photosensitive material of claim 4 wherein said composition additionally includes triphenyl-phosphine.

9. A photohardenable composition comprising a free radical addition polymerizable or crosslinkable compound, an aromatic ketone absorber and a borate salt soluble in said compound in an amount sufficient to initiate polymerization, wherein said borate salt is represented by the formula:

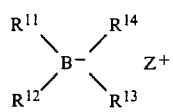

where $Z^+$ is a trimethylcetyl ammonium or a cetylpyridinium cation and $R^{11}$, $R^{12}$, $R^{13}$ and $R^{14}$ are the same or different and selected from the group consisting of alkyl, aryl, aralkyl, alkaryl, alkenyl, alkynyl, alicyclic, heterocyclic, and allyl groups.

10. The photohardenable composition of claim 9 wherein said polymerizable or crosslinkable compound is an ethylenically unsaturated compound.

11. The photohardenable composition of claim 9 wherein one of $R^{11}$, $R^{12}$, $R^{13}$ and $R^{14}$ is an alkyl group and the balance are aryl groups.

12. The photohardenable composition of claim 10 wherein said ketone is selected from the group consisting of xanthones, thioxanthones, benzophenones, oximinoketones, polycyclic quinones, and ketocoumarins.

13. The photohardenable composition of claim 12 wherein said ketone is a ketocoumarin.

14. The photohardenable composition of claim 13 wherein said ketocourmarin is selected from the group consisting of 7-diethylamino-5',7'-dimethoxy-3,3'-carbonylbiscoumarin; 3-3'-carbonylbis(5,7-dimethoxycoumarin); 7-diethylamino-3,3'-carbonylbiscoumarin; 7-diethylamino-7'-methoxy-3,3'-carbonylbiscoumarin; 7-diethylamino-7'dimethylamono-3,3'-carbonylbiscoumarin; 7-diethylamino-3-thenoylcoumarin; 3-(2-coumariloyl)-7-diethylaminocoumarin; 3-cinnamoyl-7-diethylaminocoumarin; and 3[(4-dimethylamino)-cinnamoyl]-7-diethylaminocoumarin.

15. The photohardenable composition of claim 14 wherein said ketocoumarin is selected from the group consisting of -diethylamino-3-cinnamoylcoumarin, 7-diethylamin-3-theonoylcoumarin, and 3,3'-carbonylbis(7-diethylaminocoumarin).

16. The photohardenable composition of claim 15 wherein said composition additionally includes a phosphine.

17. The photosensitive material of claim 1 wherein said photohardenable composition is microencapsulated.

* * * * *